United States Patent
Picard

(10) Patent No.: US 7,154,929 B2
(45) Date of Patent: Dec. 26, 2006

(54) MICRO-CAVITY LIGHT EMITTING DEVICE AND METHOD FOR MAKING SAME

(75) Inventor: Emmanuel Picard, Saint Martin d'Uriage (FR)

(73) Assignee: Commissariat a l'Energie Atomique, Paris (FR)

( * ) Notice: Subject to any disclaimer, the term of this patent is extended or adjusted under 35 U.S.C. 154(b) by 35 days.

(21) Appl. No.: 10/470,747

(22) PCT Filed: Dec. 12, 2002

(86) PCT No.: PCT/FR02/04320

§ 371 (c)(1),
(2), (4) Date: Aug. 11, 2003

(87) PCT Pub. No.: WO03/050927

PCT Pub. Date: Jun. 19, 2003

(65) Prior Publication Data

US 2004/0066826 A1    Apr. 8, 2004

(30) Foreign Application Priority Data

Dec. 13, 2001 (FR) .................... 01 16119

(51) Int. Cl.
  *H01S 3/093* (2006.01)
  *H01S 3/09* (2006.01)
  *H01S 3/091* (2006.01)
  *H01L 27/15* (2006.01)

(52) U.S. Cl. .................... 372/72; 372/75; 372/69; 257/79

(58) Field of Classification Search ............ 372/69–75; 257/79

See application file for complete search history.

(56) References Cited

U.S. PATENT DOCUMENTS

| | | | | |
|---|---|---|---|---|
| 5,513,204 A | * | 4/1996 | Jayaraman | 372/96 |
| 5,754,578 A | * | 5/1998 | Jayaraman | 372/50.1 |
| 5,796,711 A | * | 8/1998 | Tomita et al. | 369/275.4 |
| 5,892,786 A | * | 4/1999 | Lott | 372/50.124 |
| 5,933,444 A | * | 8/1999 | Molva et al. | 372/75 |
| 5,982,802 A | * | 11/1999 | Thony et al. | 372/75 |
| 6,252,896 B1 | * | 6/2001 | Tan et al. | 372/50.11 |
| 6,285,704 B1 | * | 9/2001 | Kullander-Sjoberg et al. | 372/96 |
| 6,339,607 B1 | * | 1/2002 | Jiang et al. | 372/50 |
| 6,377,593 B1 | * | 4/2002 | Peterson et al. | 372/11 |
| 6,424,669 B1 | * | 7/2002 | Jiang et al. | 372/50 |

(Continued)

FOREIGN PATENT DOCUMENTS

DE   195 23 267   1/1997

(Continued)

OTHER PUBLICATIONS

V. Jayaraman et al.: "Continuous-wave operation of single-transverse-mode 1310-NM VCSELS up to 115° C." IEEE Photonics Technology Letters, IEEE Inc., vol. 12, No. 12, pp. 1595-1597 Dec. 1, 2000.

(Continued)

*Primary Examiner*—Minsun Oh Harvey
*Assistant Examiner*—Phillip Nguyen
(74) *Attorney, Agent, or Firm*—Oblon, Spivak, McClelland, Maier & Neustadt, P.C.

(57) ABSTRACT

A device for emission of light is made including an emitting structure including an active part and a micro-cavity, delimited by mirrors and containing the active part, and a laser diode designed for pumping the emitting structure. The emitting structure is fixed to the laser diode. The device is particularly applicable to the detection of gas.

5 Claims, 3 Drawing Sheets

U.S. PATENT DOCUMENTS

| | | | |
|---|---|---|---|
| 6,347,108 B1 * | 2/2003 | Jiang et al. | 372/50 |
| 6,553,048 B1 * | 4/2003 | Jiang et al. | 372/50 |
| 6,580,741 B1 * | 6/2003 | Jiang et al. | 372/50.11 |
| 6,627,923 B1 * | 9/2003 | Lipson et al. | 257/102 |
| 6,879,618 B1 * | 4/2005 | Cok et al. | 372/70 |
| 2004/0061117 A1 * | 4/2004 | Picard et al. | 257/79 |

FOREIGN PATENT DOCUMENTS

EP          0 803 946          10/1997

OTHER PUBLICATIONS

E. Hadji et al.: "Photopumped infrared vertical-cavity surface-emitting laser" Applied Physics Letters, vol. 68, No. 18, pp. 2480-2482, Apr. 29, 1996.

Technology & Applications Technical Bulletin http://www.nanolase.com/public/technology/tecbulletin1.cfm.

C. Roux et al.: "Room-temperature optically pumped CdHgTe vertical-cavity surface-emitting laser for the 1.5 μm range" Applied Physics Letters, vol. 75, No. 12, pp. 1661-1663, Sep. 20, 1999.

E. Hadji et al.: "3.3- μm microcavity light emitter for gas detection" Optical Society of America 2000.

* cited by examiner

MICRO-CAVITY LIGHT EMITTING DEVICE AND METHOD FOR MAKING SAME

TECHNICAL DOMAIN

This invention relates to a micro-cavity device for emission of light and a process for making such a device, including an emitting structure photo-pumped by a laser diode.

More particularly, the invention relates to a micro-cavity device for emission of light, in the medium infrared range from 2 μm to 6 μm, and a process for manufacturing such a device.

The invention is particularly applicable to:

- detection of gas, more particularly in the automobile industry field (measurement of the exhaust gas concentration) and in the climatology field (measurement of carbon dioxide in the atmosphere) and
- automatic sort of plastics that also absorb in the infrared at different wavelengths depending on their composition.

STATE OF PRIOR ART

A micro-cavity device for emission of light in the medium infrared range usually comprises an active part made of CdHgTe that is inserted in a micro-cavity. The micro-cavity is delimited by two Bragg mirrors added on to the active part.

The micro-cavity is very short, on the order of a few half wavelengths, and determines the wavelength of the emitted light.

In this type of light emission device, excitation of the emitting structure must be as intense as possible. Two excitation techniques are known for obtaining excitation power densities exceeding 100 W/cm$^2$.

The first of these techniques consists of photo-pumping the emitting structure of the device by a laser emitting a light beam with a very weak divergence. Further information about this subject is given in the following document:

C. Roux et al., Appl. Phys. Lett., Vol. 75, No. 12, 1999, pp. 1661–1663.

However, the laser installation is relatively large and expensive compared with the emitting structure.

The second known technique consists of photo-pumping this emitting structure by a laser diode emitting a large divergence light beam that is focused by an appropriate optical installation. Further information about this subject is given in a technical bulletin by the Nanolase company entitled: "Technology and Applications". The light beam emitted by the laser diode has to be focused because the power density in this beam reduces very quickly as a function of the distance.

This focusing is achieved by inserting appropriate optical means between the pumping diode and the emitting structure (collection and focusing lens) that must be aligned with respect to the diode and the emitting structure.

However, this alignment considerably increases the difficulty of manufacturing and the cost of the device.

Refer also to the following document:

E. Hadji et al., Optics Lett., Vol. 25, No. 10, 2000, pp. 725–727.

The device disclosed in this document also requires a precise alignment of an emitting structure, a laser diode and a lens between them.

PRESENTATION OF THE INVENTION

This invention is intended to overcome the disadvantages described above.

The invention proposes a micro-cavity device for light emission, in which the emitting structure is pumped by a laser diode without focusing light emitted by this diode, while keeping an efficiency equivalent to the efficiency of the device disclosed in the Nanolase company bulletin mentioned above.

Furthermore, the invention provides a means of obtaining a very compact light emission device within the range from 2 micrometers to 6 micrometers. Specifically, the purpose of this invention is to provide a light emission device, this device comprising:

- an emitting structure comprising an active part and a micro-cavity, delimited by first and second mirrors and containing the active part, and
- a laser diode designed for optical pumping of the emitting structure through the first mirror of this structure, wherein the emitting structure is fixed to the laser diode. According to one preferred embodiment of the device according to the invention, the active part is able to emit infrared radiation with a wavelength within the interval of from 2 μm to 6 μm.

According to a first particular embodiment of the device according to the invention, the emitting structure also comprises a plate that is transparent to light generated by the laser diode and that is fixed to this laser diode.

According to a second particular embodiment, the laser diode comprises a port and the emitting structure is formed on this port.

According to a third particular embodiment, the emitting structure also comprises a plate that is transparent to light generated by the laser diode and that acts as a port for this diode.

This invention also relates to a process for manufacturing the device according to the invention in which the emitting structure is formed, and this emitting structure is fixed to the laser diode.

According to one particular embodiment of the process according to the invention, the active part is formed on a substrate and the first mirror is formed on this active part, this first mirror is fixed onto the transparent plate, the substrate is eliminated, the second mirror is formed on the active part and the plate is fixed to the laser diode. According to a second particular embodiment, the laser diode comprises a port and the active part is formed on a substrate and the first mirror is formed on this active part, the first mirror is fixed on the port of the laser diode, the substrate is eliminated and the second mirror is formed. According to a third particular embodiment, the laser diode comprises a port and the active part is formed on a substrate and the first mirror is formed on this active part, this first mirror is fixed on the transparent plate, the substrate is eliminated, the second mirror is formed on the active part, the port is eliminated and the port is replaced by the transparent plate.

Preferably, the emitting structure is fixed to the laser diode using a glue that is transparent to light emitted by this laser diode.

BRIEF DESCRIPTION OF THE DRAWINGS

This invention will be better understood after reading the description of example embodiments given below, for information purposes only and in no way limitatively, with reference to the appended drawings, wherein.

DETAILED DESCRIPTION OF THE INVENTION

Figure 1A:
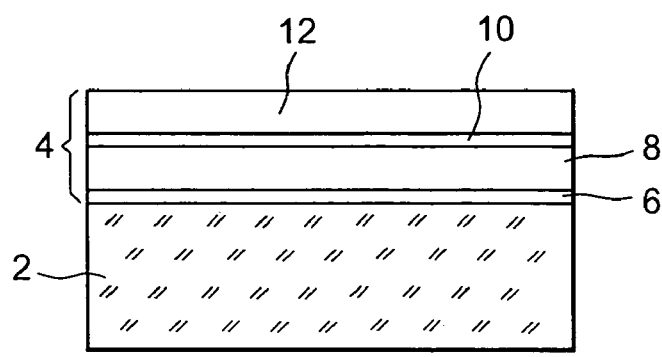
FIGS. 1A to 1E diagrammatically show the steps in a particular embodiment of the process according to the invention.
Figure 1B:
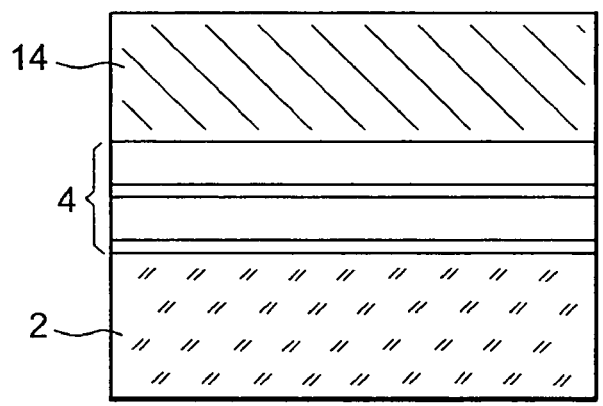
Figure 1C:
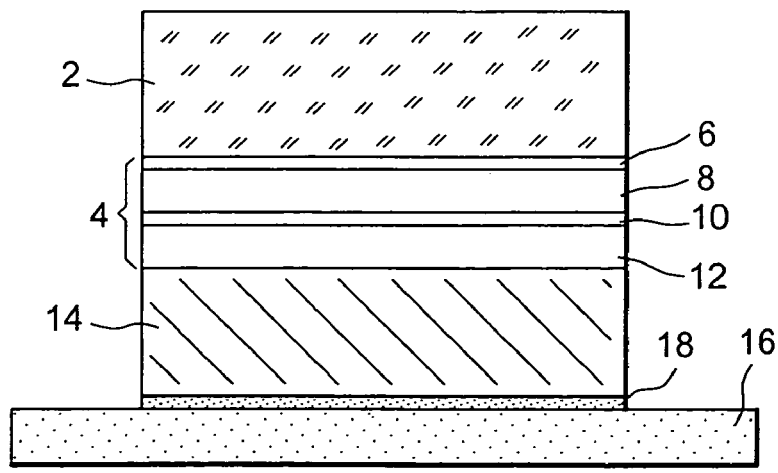

The following description applies to an example of a process according to the invention with reference to FIGS. 1A to 1E.

This process can be implemented by forming an emitting structure on a substrate 2, for example made of CdZnTe (FIG. 1A), capable of generating infrared radiation when it is optically pumped.

For example, the thickness of substrate 2 is 750 µm.

The emitting structure is formed by forming an active part 4 made of CdHgTe on the substrate 2, by epitaxy. In this example, this active part is a stack comprising a layer 6 of HgTe, a layer 8 of $Cd_{0.7}Hg_{0.3}Te$, a layer 10 of $Cd_{0.3}Hg_{0.7}Te$ and a layer 12 of $Cd_{0.7}Hg_{0.3}Te$, in sequence.

A Bragg mirror 14 (FIG. 1B) called a "background mirror" is then formed on this layer 12, for which the reflectivity (for radiation generated by the active part) is very high and is equal for example to 99%.

This background mirror 14 is then glued on a silica plate 16 (FIG. 1C), with a thickness for example equal to 300 µm, using a layer of glue 18 transparent to the light intended for optical pumping of the emitting structure.

Figure 1D:
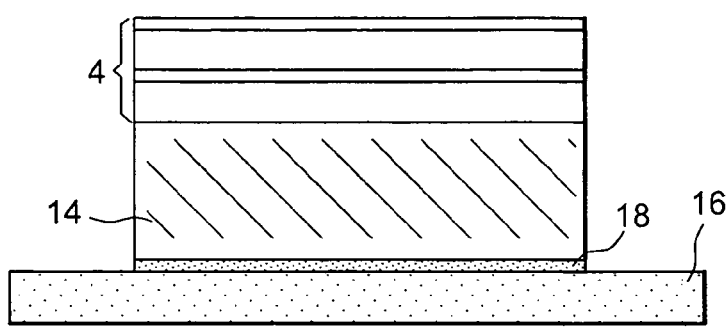

The next step is to eliminate the substrate 2. The starting point is to remove 600 µm of the substrate by mechanical polishing. The remaining 150 µm are then chemically etched (FIG. 1D). This is achieved using chemical etching that is selective towards HgTe. This etching is done by a mix of acids, and stops on layer 6.

Figure 1E:
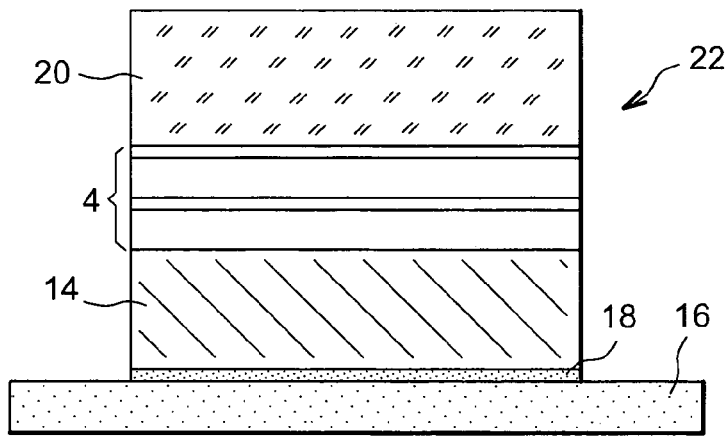

The next step is to form another Bragg mirror 20 called an "output mirror" on the layer 6, by an appropriate deposit (FIG. 1E).

For example, the reflectivity of this mirror 20 is 60% for radiation emitted by the active part 4, for which the wavelength is equal for example to 3.3 µm.

Note that the reflectivity of the background mirror 14 is very low for optical pumping light for which the wavelength is equal to 1.06 µm, for example.

The emitting structure 22 thus obtained comprising a micro-cavity delimited by mirrors 14 and 20 is then glued on the casing 24 (FIG. 2) of the laser diode 26 intended for optical pumping of this structure. This is done using a layer 28 of a glue that is transparent to light generated by this laser diode.

Figure 2:
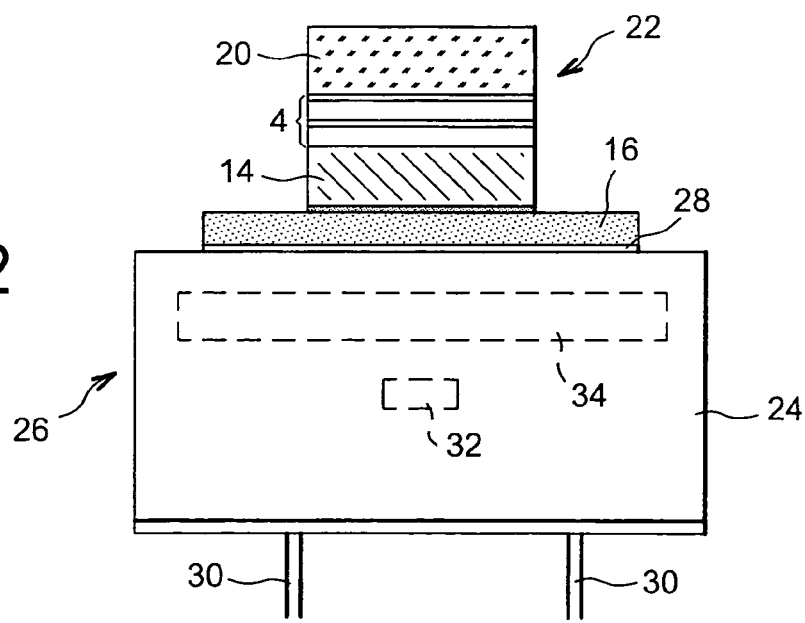
FIG. 2 is a diagrammatic view of a particular embodiment of the device according to the invention, FIGS. 3A and 3B diagrammatically show the steps in another particular embodiment of the process according to the invention.

FIG. 2 also shows electrodes 30 that are included in the laser diode 26 and the emission area 32 of this diode and the port 34 of this diode, which is between this area 32 and the emitting structure 22.

For example, the distance between the emission area 32 and the emitting structure 22 may be equal to 1 mm.

Figure 3A:
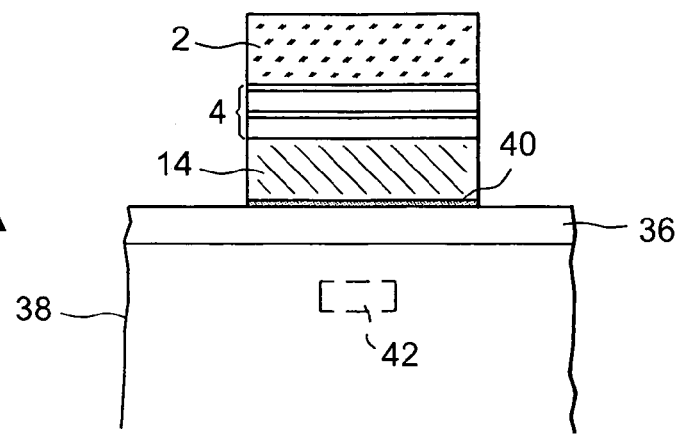

The silica plate 16 is eliminated, so that a laser diode with a lower pumping power can be used without changing the power density, and so that the efficiency of the device can be significantly increased. More precisely, the step in which the bottom mirror 14 is glued (described with-reference to FIG. 1C) is directly performed onto the port 36 of a laser pumping diode 38, as shown diagrammatically in FIG. 3A.

This is done using a glue layer 40 transparent to light emitted by this diode, for which the emission area 42 is also seen.

Figure 3B:
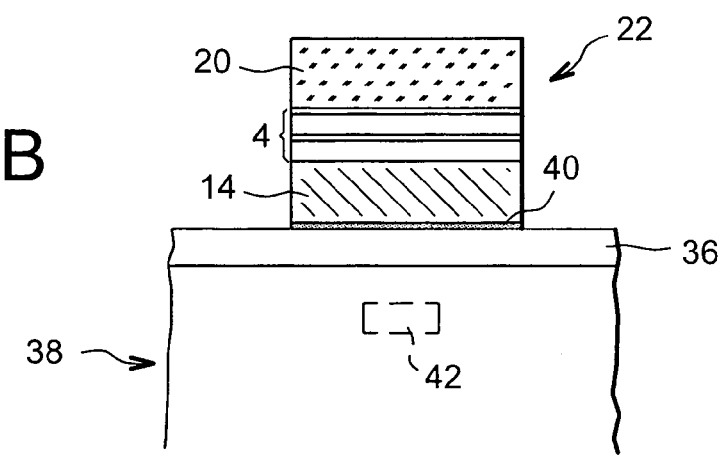

Then, after protecting the laser diode 38, the step for mechanical polishing of the substrate 2 is applied followed by the selective chemical etching step to eliminate the rest of this substrate, and the output mirror 20 deposition step (FIG. 3B) is then performed as described above.

The procedure for protecting the laser pumping diode 38 is as follows: this diode 38 is protected by a mask during the step to deposit the material making up the mirror. For example, this mask is made of aluminium.

Figure 4:
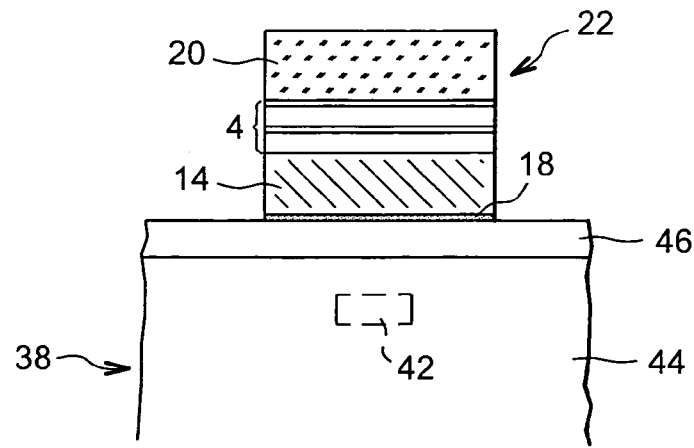
FIG. 4 is a diagrammatic view of another particular embodiment of the device according to the invention.

Instead of forming the emitting structure on the port, the casing 44 (FIG. 4) of the laser pumping diode 38 can be cut out in order to remove the original port and replace this port by a silica plate 46 with the same dimensions as this original port and supporting the emitting structure, this structure firstly being formed and then glued on this plate 46 as was seen above with reference to FIGS. 1A to 1E.

This process makes it possible to eliminate a step in manufacturing of the device and also to improve the external efficiency of this device by a factor of 10.

For information purposes only, and in no way limitatively, the laser diode 38 may be of the type marketed by the Thorlabs Inc. company, with reference HL 7851G.

The Invention claimed is:

1. Device for emission of light, comprising:
   an emitting structure comprising an active part and a micro-cavity, delimited by first and second mirrors and containing the active part;
   a laser diode configured for optical pumping of the emitting structure through the first mirror of the emitting structure;
   wherein the emitting structure is fixed to the laser diode, and wherein the emitting structure further comprises a plate that is transparent to light generated by the laser diode and which is fixed to the laser diode and,
   wherein the active part is configured to emit infrared radiation with a wavelength within an interval from 2 µm to 6 µm.

2. Process for manufacturing a device for emission of light, which comprises:
   providing an emitting structure having an active part and a micro-cavity, delimited by first and second mirrors and containing said active part;
   providing a laser diode configured for optical pumping of the emitting structure through the first mirror of the emitting structure; and
   fixing the emitting structure to the laser diode, the emitting structure comprising a plate which is transparent to light generated by the laser diode
   wherein said active part is formed on a substrate and the first mirror is formed on the active part, the first mirror is fixed onto the transparent plate, the substrate is eliminated, and the second mirror is formed on the active part.

3. Process for manufacturing a device for emission of light, which comprises:
   providing an emitting structure having an active part and a micro-cavity, delimited by first and second mirrors and containing said active part;
   providing a laser diode configured for optical pumping of the emitting structure through the first mirror of the emitting structure; and fixing the emitting structure to the laser diode, the emitting structure comprising a plate which is transparent to light generated by the laser diode, wherein the laser diode comprises a port and said active part is formed on a substrate, and the first mirror is formed on the active part, the first mirror is fixed on the transparent plate, the substrate is eliminated, the second mirror is formed on the active part, the port is eliminated, and the port is replaced by the transparent plate.

4. Process for manufacturing the device, as claimed in claim 2, which comprises fixing the emitting structure to the laser diode using a glue that is transparent to light emitted by the laser diode.

5. Process for manufacturing the device, as claimed in claim 3, which comprises fixing the emitting structure to the laser diode using a glue that is transparent to light emitted by the laser diode.

* * * * *